US010334232B2

(12) United States Patent
Tsai et al.

(10) Patent No.: US 10,334,232 B2
(45) Date of Patent: Jun. 25, 2019

(54) DEPTH-SENSING DEVICE AND DEPTH-SENSING METHOD

(71) Applicant: HIMAX TECHNOLOGIES LIMITED, Tainan (TW)

(72) Inventors: Chin-Jung Tsai, Tainan (TW); Yi-Nung Liu, Tainan (TW)

(73) Assignee: HIMAX TECHNOLOGIES LIMITED, Tainan (TW)

(*) Notice: Subject to any disclaimer, the term of this patent is extended or adjusted under 35 U.S.C. 154(b) by 0 days.

(21) Appl. No.: 15/811,594

(22) Filed: Nov. 13, 2017

(65) Prior Publication Data
US 2019/0149796 A1    May 16, 2019

(51) Int. Cl.
*H04N 13/271* (2018.01)
*G06T 7/521* (2017.01)
(Continued)

(52) U.S. Cl.
CPC .......... *H04N 13/271* (2018.05); *G06T 7/521* (2017.01); *H04N 13/254* (2018.05);
(Continued)

(58) Field of Classification Search
CPC .. H04N 13/271; H04N 13/254; H04N 13/296; G06T 7/521; G06T 2207/10028; G06T 2207/20221; H01S 5/183
(Continued)

(56) References Cited

U.S. PATENT DOCUMENTS 9,521,399 B1* 12/2016 Hazeghi .............. G01B 11/2513
2013/0050426 A1* 2/2013 Sarmast .................. G01S 17/89
                                                              348/46
(Continued)

FOREIGN PATENT DOCUMENTS

CN    102959355    3/2013
CN    103017739    4/2013
(Continued)

OTHER PUBLICATIONS

Firtth et al., "Diffusion, Diffraction and Reflection in Semiconductor o.b. Devices," Philosophical Transactions of the Royal Society of London, Series A, Mathematical and Physical Sciences, vol. 313, No. 1525, Optical Bistability, Dynamical Nonlinearity and Photonic Logic, Dec. 18, 1984, pp. 299-306. (Year: 1984).*
(Continued)

*Primary Examiner* — Reza Aghevli
(74) *Attorney, Agent, or Firm* — JCIPRNET

(57) ABSTRACT

A depth-sensing device and its method are provided. The depth-sensing device includes a projection device, an image capture device, and an image processing device. The projection device projects a first projection pattern to a field at a first time and projects a second projection pattern to the same field at a second time. The density of the first projection pattern is lower than the density of the second projection pattern. The image capture device captures the first projection pattern projected to the field at the first time to obtain a first image and captures the second projection pattern projected to the field at the second time to obtain a second image. The image processing device processes the first and second images to obtain two depth maps and at least merges the depth maps to generate a final depth map of the field.

20 Claims, 6 Drawing Sheets

(51) Int. Cl.
  *H04N 13/254* (2018.01)
  *H04N 13/296* (2018.01)
  *H01S 5/183* (2006.01)

(52) U.S. Cl.
  CPC . *H04N 13/296* (2018.05); *G06T 2207/10028* (2013.01); *G06T 2207/20221* (2013.01); *H01S 5/183* (2013.01)

(58) Field of Classification Search
  USPC .......................................................... 348/46
  See application file for complete search history.

(56) References Cited

U.S. PATENT DOCUMENTS

| | | | |
|---|---|---|---|
| 2014/0016862 | A1 | 1/2014 | Taguchi |
| 2014/0306874 | A1* | 10/2014 | Finocchio ............... G06F 3/017 345/156 |
| 2015/0381967 | A1 | 12/2015 | Lee et al. |
| 2016/0012602 | A1* | 1/2016 | Xu ........................... G06K 9/36 382/154 |
| 2016/0050401 | A1* | 2/2016 | Gordon .................... G01C 3/02 348/744 |
| 2016/0063309 | A1* | 3/2016 | Konolige ........... G06K 9/00201 382/153 |
| 2018/0192033 | A1* | 7/2018 | Gallup ................... H04N 5/247 |
| 2018/0324399 | A1* | 11/2018 | Spears ............... H04N 5/23238 |

FOREIGN PATENT DOCUMENTS

| | | |
|---|---|---|
| CN | 105572687 | 5/2016 |
| TW | 201612853 | 4/2016 |
| TW | 201733350 | 9/2017 |

OTHER PUBLICATIONS

Salvi et al., "Pattern codification strategies in structured light systems," The Journal of Pattern Recognition Society, vol. 37, Issue 4, Apr. 2004, pp. 827-849. (Year: 2004).*

Firth et al., "Diffusion, Diffration and Reflection in Semiconductor o.b. Devies," Roral Society of London, Mathematical and Physical Sciences, vol. 313, No. 1525, Dec. 18, 1984, pp. 299-306. (Year: 1984).*

Salvi et al., "Pattern codification strategies in structured light systems," Pattern Recognition, 37, 2004, pp. 827-849. (Year: 2004).*

"Office Action of Taiwan Counterpart Application," dated Feb. 8, 2018, p. 1-p. 9, in which the listed references were cited.

* cited by examiner

DEPTH-SENSING DEVICE AND DEPTH-SENSING METHOD

BACKGROUND OF THE INVENTION

Field of the Invention

The invention relates to a depth-sensing device and method, and more particularly, to a depth-sensing device and method generating a depth map.

Description of Related Art

In general, depth sensing of 3D space can generate depth information of an object via a light projector and a light receiver. However, the working range of the traditional depth sensor is generally decided by the structure of the sensor itself, such as the resolution and depth of field of the camera lens. Therefore, the working distance of the traditional depth sensor generally is not suitable for both a nearby scene and a distant scene.

Therefore, a depth-sensing device and method are needed to obtain depth information of a near-field region and a far-field region without changing the hardware structure.

SUMMARY OF THE INVENTION

The invention provides a depth-sensing device and a depth-sensing method that can effectively expand the working range of the depth-sensing device.

An embodiment of the invention provides a depth-sensing device. The depth-sensing device includes a projection device, an image capture device, and an image processing device. The projection device projects a first projection pattern to a field at a first time and projects a second projection pattern to the field at a second time. The density of the first projection pattern is lower than the density of the second projection pattern. The image capture device captures the first projection pattern projected to the field at the first time to obtain a first image and captures the second projection pattern projected to the field at the second time to obtain a second image. The image processing device is coupled to the projection device and the image capture device. The image processing device processes the first image to obtain a first depth map and processes the second image to obtain a second depth map. The image processing device at least merges the first depth map and the second depth map to generate a final depth map of the field.

An embodiment of the invention provides a depth-sensing method. The depth-sensing method includes a projection step, an image capture step, an image processing step, and a merging step. The projection step projects a first projection pattern to a field at a first time and projects a second projection pattern to the field at a second time, wherein the density of the first projection pattern is lower than the density of the second projection pattern. The image capture step captures the first projection pattern projected to the field at the first time to obtain a first image and captures the second projection pattern projected to the field at the second time to obtain a second image. The image processing step processes the first image to obtain a first depth map and processes the second image to obtain a second depth map. The merging step at least merges the first depth map and the second depth map to generate a final depth map of the field.

Based on the above, the depth-sensing device and the depth-sensing method of the embodiments of the invention can alternately project the first projection pattern and the second projection pattern having different densities to the same field to perform depth sensing on the field. Based on the first projection pattern and the second projection pattern having different densities, the depth-sensing device can obtain a first depth map and a second depth map having different content. The depth-sensing device can at least merge the first depth map and the second depth map to generate the final depth map of the field. Therefore, the working range of the depth-sensing device can be effectively expanded.

In order to make the aforementioned features and advantages of the disclosure more comprehensible, embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
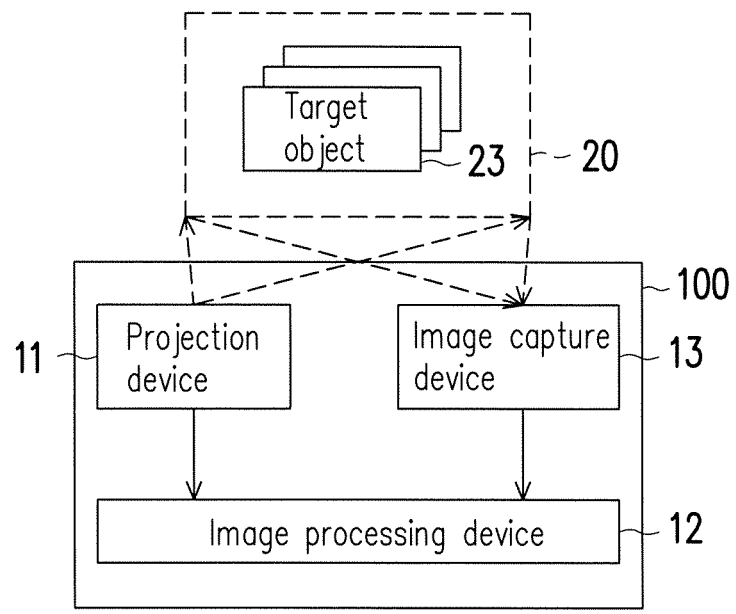
FIG. 1 is a schematic of a circuit block of a depth-sensing device according to an embodiment of the invention.

The term "coupled to (or connected to)" used in the entire text of the specification of the present application (including claims) can refer to any direct or indirect connecting means. For instance, if a first device is coupled to (or connected to) a second device, then it should be understood that the first device can be directly connected to the second device, or the first device can be indirectly connected to the second device via other devices or certain connecting means. Moreover, when applicable, devices/components/steps having the same reference numerals in figures and embodiments represent the same or similar parts. Devices/components/steps having the same reference numerals or having the same terminology in different embodiments can be cross-referenced.

FIG. 1 is a circuit block schematic of a depth-sensing device 100 according to an embodiment of the invention. As shown in FIG. 1, the depth-sensing device 100 includes a projection device 11, an image processing device 12, and an image capture device 13. According to design requirements, the image processing device 12 can include a central processing unit (CPU), microprocessor, digital signal processor (DSP), programmable controller, application-specific integrated circuit (ASIC), programmable logic device (PLD), or other image processing circuits/elements. The image processing device 12 is coupled to the projection device 11 and the image capture device 13. The projection device 11 can project different projection patterns having different densities to a same field 20 at different times. Based on actual application, the field 20 can have one or a plurality of target objects 23, or the field 20 may not contain a target object 23.

Figure 2:
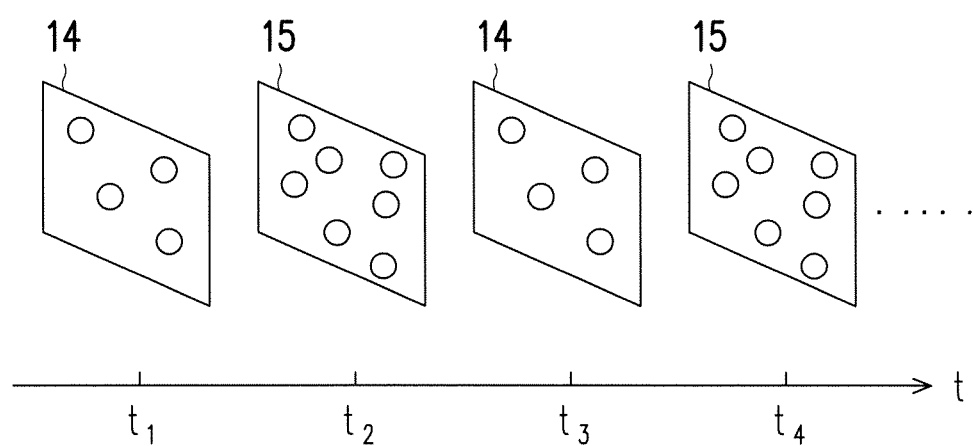
FIG. 2 shows projection pattern schematics at different densities generated by the projection device of FIG. 1 at different times.

FIG. 2 shows different projection pattern schematics at different densities generated by the projection device 11 of FIG. 1 at different times. The horizontal axis in FIG. 2 is a time t. The first projection pattern 14 shown in FIG. 2 has fewer light spots and the second projection pattern 15 has more light spots. That is, the density of the first projection pattern 14 is lower than the density of the second projection pattern 15. Referring to FIG. 1 and FIG. 2, the projection device 11 can alternately project different projection patterns having different densities to the same field 20 at different times. For instance, the projection device 11 can project a first projection pattern 14 to the field 20 at a first time $t_1$, project a second projection pattern 15 to the field 20 at a second time $t_2$, project the first projection pattern 14 to the field 20 at a third time $t_3$, project the second projection pattern 15 to the field 20 at a fourth time $t_4$, and so on. In particular, the density of the first projection pattern 14 is lower than the density of the second projection pattern 15. Although the embodiment shown in FIG. 2 includes two projection patterns, in other embodiments, the projection device 11 can alternately project three (or more) projection patterns having different densities to the same field 20 at different times.

The first projection pattern 14 and the second projection pattern 15 can be disordered spot patterns or regularly-arranged spot patterns. The density level of the spots (spot density) of the first projection pattern 14 is different from the density level of the spots (spot density) of the second projection pattern 15. For instance, the spot density of the first projection pattern 14 can be lower than the spot density of the second projection pattern 15. It should be mentioned that, the density only represents the relative degree of sparseness or denseness. For instance, the spot density of the second projection pattern 15 can be 2 to 3 times the spot density of the first projection pattern 14, and the present embodiment does not limit the density of the projection pattern. For a near-field region, a projection pattern having lower spot density can have better depth resolution. For a far-field region, a projection pattern having higher spot density can have better depth resolution.

The projection device 11 can provide projection time information and/or projection pattern information to the image processing device 12. According to the projection time information provided by the projection device 11, the image capture device 13 can alternately capture projection patterns projected to the field 20 at different times. For instance, the image capture device 13 can capture the first projection pattern 14 projected to the field 20 at the first time $t_1$ to obtain a first image. At the second time $t_2$, the image capture device 13 can capture the second projection pattern 15 projected to the field 20 to obtain a second image. At the third time $t_3$, the image capture device 13 can capture the first projection pattern 14 projected to the field 20 to obtain a third image. At the fourth time $t_4$, the image capture device 13 can capture the second projection pattern 15 projected to the field 20 to obtain a fourth image. And the rest may be arrived at by deduction.

According to design requirements, the image capture device 13 can be a digital camera, monocular camera, smart phone, tablet computer, personal digital assistant, or other electronic devices having image capture function. The image capture device 13 includes a photosensitive device (not shown) to sense the received light intensity to generate an image. The photosensitive device can be a charge-coupled device (CCD), complementary metal-oxide-semiconductor (CMOS) device, or other photosensitive devices. When the projection beam (projection pattern) emitted by the projection device 11 is infrared, the image capture device 13 can be an infrared image capture device to identify the first projection pattern 14 and the second projection pattern 15 projected to the field 20.

The image processing device 12 is coupled to the image capture device 13 to receive an image. In the following, the first image obtained at the first time $t_1$ and the second image obtained at the second time $t_2$ are exemplified. The processing of images obtained at other times is as provided for the images obtained at the times $t_1$ and $t_2$ and is therefore not repeated herein. The image processing device 12 processes the first image provided by the image capture device 13 to obtain a first depth map. The image processing device 12 processes the second image provided by the image capture device 13 to obtain a second depth map.

The first projection pattern 14 and the second projection pattern 15 can be regarded as coding patterns. When these coding patterns are projected to the field 20 having different depth planes, the projection positions of incident light and reflected light are offset. That is, an offset exists between the position of one spot in the ground truth pattern and the position of the same spot in the captured image. Therefore, by decoding the offset of the spot positions, the image processing device 12 can estimate the depth information of the field 20. According to the projection pattern information provided by the projection device 11, the image processing device 12 can confirm the ground truth pattern. The image processing device 12 can perform a depth map algorithm using the ground truth pattern and the image provided by the image capture device 13.

For instance, in some embodiments, when the first projection pattern 14 is projected to the field 20, the first projection pattern 14 can be used as the ground truth pattern; at this point, the image capture device 13 can capture the first projection pattern 14 projected to the field 20 to obtain a first image. The image processing device 12 can perform a depth map algorithm using the ground truth pattern and the first image provided by the image capture device 13 to obtain a first depth map. When the second projection pattern 15 is projected to the field 20, the second projection pattern 15 can be used as the ground truth pattern; at this point, the image capture device 13 can capture the second projection pattern 15 projected to the field 20 to obtain a second image. The image processing device 12 can perform a depth map algorithm using the ground truth pattern and the second image provided by the image capture device 13 to obtain a second depth map. The present embodiment does not limit the depth map algorithm of the image processing device 12. According to design requirements, the image processing device 12 can adopt a known algorithm or other depth map algorithms to process the image provided by the image capture device 13. The details of the known algorithm are not repeated herein.

The image processing device 12 at least merges the first depth map and the second depth map to generate the final depth map of the field 20. The first projection pattern 14 having lower spot density can have better depth resolution for a near-field region. The second projection pattern 15 having higher spot density can have better depth resolution for a far-field region. In other words, the first depth map corresponding to the first projection pattern 14 has more reliable depth information for a near-field region, and the second depth map corresponding to the second projection pattern 15 has more reliable depth information for a far-field region. The image processing device 12 can merge the depth information related to the near-field region in the first depth map and the depth information related to the far-field region in the second depth map to the final depth map. Therefore, the depth-sensing device 100 can effectively expand the working range of the depth-sensing device 100.

Figure 3:
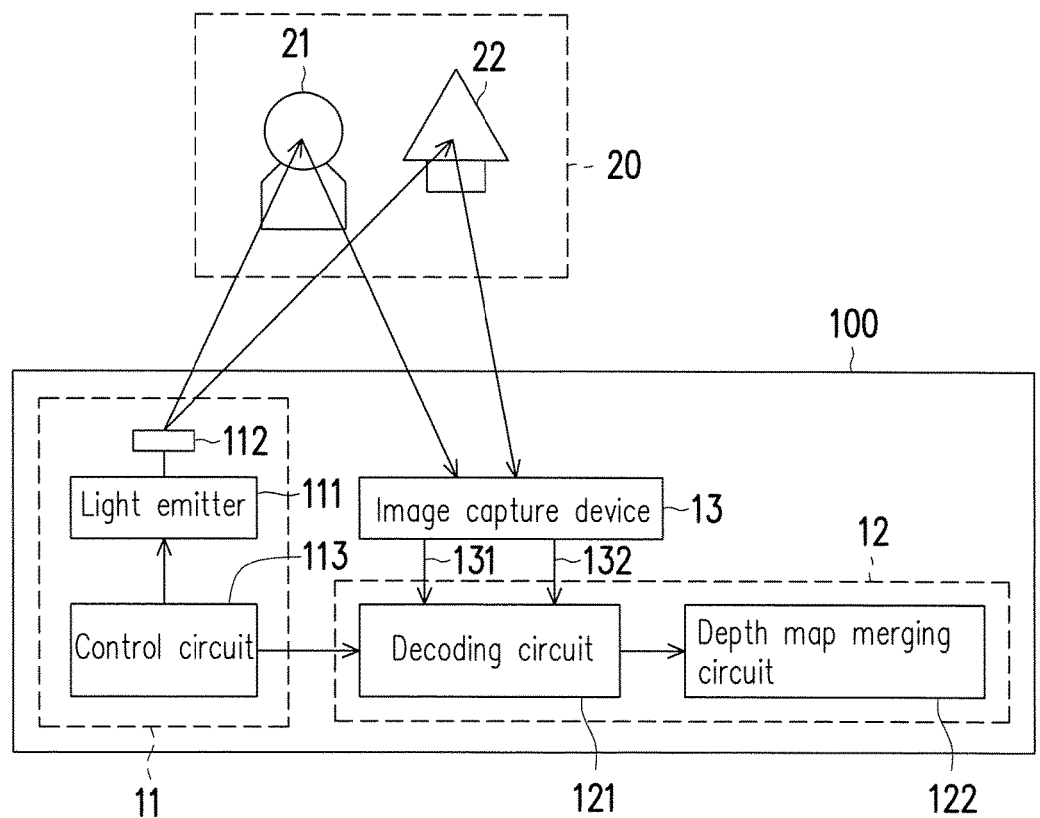
FIG. 3 shows a circuit block schematic of the projection device and the image capture device in FIG. 1 according to an embodiment of the invention.

FIG. 3 shows a circuit block schematic of the projection device 11 and the image capture device 13 in FIG. 1 according to an embodiment of the invention. In the embodiment shown in FIG. 3, the projection device 11 includes a light emitter 111, a lens set 112, and a control circuit 113. The lens set 112 is disposed in the optical path of the light emitter 111. The control circuit 113 is coupled to the light emitter 111. The control circuit 113 can control the light emitter 111 to generate projection patterns having different densities. Based on the control of the control circuit 113, the light emitter 111 can alternately project projection patterns having different densities to the field 20 at different times.

According to design requirements, in the embodiment shown in FIG. 3, the light emitter 111 can be a vertical-cavity surface-emitting laser (VCSEL) array, and the array is formed by a plurality of VCSEL elements. The control circuit 113 can control the light emission of each VCSEL element in the light emitter 111 to generate projection patterns having different densities at different times. For instance, based on the control of the control circuit 113, the light emitter 111 can generate the first projection pattern 14 at the first time $t_1$, and project the first projection pattern 14 to the field 20 via the lens set 112. The light emitter 111 can generate the second projection pattern 15 at the second time $t_2$ and project the second projection pattern 15 to the field 20 via the lens set 112. By extension, the light emitter 111 can alternately project the first projection pattern 14 and the second projection pattern 15 to the field 20.

Figure 4:
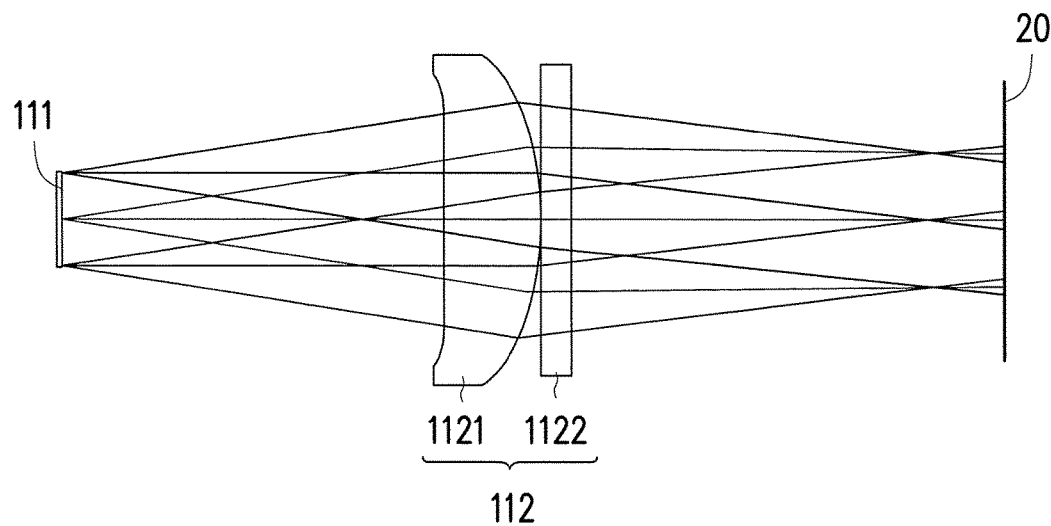
FIG. 4 shows a light path configuration schematic of the light emitter and lens set in FIG. 3.

FIG. 4 shows a light path configuration schematic of the light emitter 111 and the lens set 112 in FIG. 3. The lens set 112 can include one or a plurality of lenses and other optical devices. In the present embodiment, the lens set 112 can include a first lens 1121 and a light diffusion element 1122 and is disposed in the optical path of the light emitter 111. The light diffusion element 1122 can be a diffractive optical element (DOE) or other light diffusion elements. After the light emitter 111 emits the projection beam, the projection beam first converges via the first lens 1121 and then the projection pattern is projected to the field 20 via the light diffusion element 1122. The projection beam emitted by the light emitter 111 can be invisible light (such as infrared or lights of other wavebands) or visible light.

Please refer to FIG. 3. The image processing device 12 can include a decoding circuit 121 and a depth map merging circuit 122. The decoding circuit 121 is coupled to the image capture device 13 and the depth map merging circuit 122. In the embodiment shown in FIG. 3, the control circuit 113 can send a decoding parameter to the decoding circuit 121. For instance, based on design requirements, the coding parameter can include, for instance, the density state of the projection pattern, the position of the pixel to be decoded, or pixel range. The decoding circuit 121 respectively decodes (depth map algorithm) a first image 131 and a second image 132 according to the decoding parameters sent by the control circuit 113 to generate the first depth map corresponding to the first image 131 and the second depth map corresponding to the second image 132.

The depth map merging circuit 122 merges the first depth map and the second depth map generated by the decoding circuit 121 to estimate the depth information of the field 20 (final depth map of the field 20). In some embodiments, the depth map merging circuit 122 can merge the first depth pattern and the second depth pattern by fusion.

In one scenario, the working distance of the image capture device 13 can be between 50 cm and 400 cm. If a near-field region 21 (such as a person nearby) of the field 20 is located 25 cm in front of the image capture device 13 and a far-field region 22 (such as a tree in the distance) of the field 20 is located 200 cm front of the image capture device 13, then the image capture device 13 can capture a clear image of the far-field region 22, but cannot capture a clear image of the near-field region 21.

In the present embodiment, the light emitter 111 projects the first projection pattern 14 having a low density to the field 20 at the time $t_1$, and at the same time, the image capture device 13 captures the first projection pattern 14 projected to the field 20 to obtain the first image 131. The first projection pattern 14 having lower spot density can have better depth resolution for the near-field region 21. Since the spots in the first projection pattern 14 are less dense, even though the first image 131 is blurrier, the decoding circuit 121 of the image processing device 12 can still identify the general distribution position of the spots in the first image 131. Therefore, the decoding circuit 121 of the image processing device 12 can perform subsequent image processing and depth map algorithm using the first projection pattern 14 (ground truth pattern) and the first image 131 to generate a first depth map. The first depth map corresponding to the first projection pattern 14 has more reliable depth information for the near-field region 21.

The light emitter 111 projects the second projection pattern 15 having a high density to the field 20 at the time $t_2$, and at the same time, the image capture device 13 captures the second projection pattern 15 projected to the field 20 to obtain the second image 132. The second projection pattern 15 having higher spot density can have better depth resolution for the far-field region 22. The decoding circuit 121 of the image processing device 12 can perform subsequent image processing and depth map algorithm using the second projection pattern 15 (ground truth pattern) and a clear second image 132 to generate a second depth map. The second depth map corresponding to the second projection pattern 15 has more reliable depth information for the far-field region 22. The depth map merging circuit 122 of the image processing device 12 can merge the depth information related to the near-field region 21 in the first depth map and the depth information related to the far-field region 22 in the second depth map to the final depth map. Therefore, the depth-sensing device 100 can extend the working range from 50 cm to 400 cm to 25 cm to 400 cm without changing the hardware structure of the image capture device 13 to effectively expand the working range of the depth-sensing device 100 and increase the sensing performance of the depth-sensing device 100.

Figure 5:
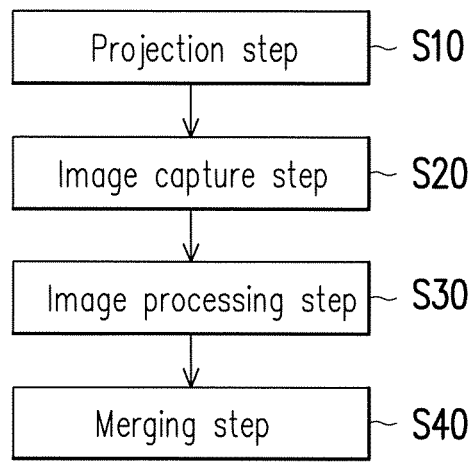
FIG. 5 is a process schematic of a depth-sensing method according to an embodiment of the invention.

FIG. 5 shows a process schematic of a depth-sensing method according to an embodiment of the invention. The depth-sensing method includes a projection step S10, an image capture step S20, an image processing step S30, and a merging step S40. Referring to FIG. 2, FIG. 3, and FIG. 5, in the projection step S10, the projection device 111 projects the first projection pattern 14 to the field 20 at the first time $t_1$ and projects the second projection pattern 15 to the field 20 at the second time $t_2$, wherein the density of the first projection pattern 14 is lower than the density of the second projection pattern 15. In the image capture step S20, the image capture device 13 captures the first projection pattern 14 projected to the field 20 at the first time $t_1$ to obtain the first image 131 and captures the second projection pattern 15 projected to the field 20 at the second time $t_2$ to obtain the second image 132.

Figure 6:
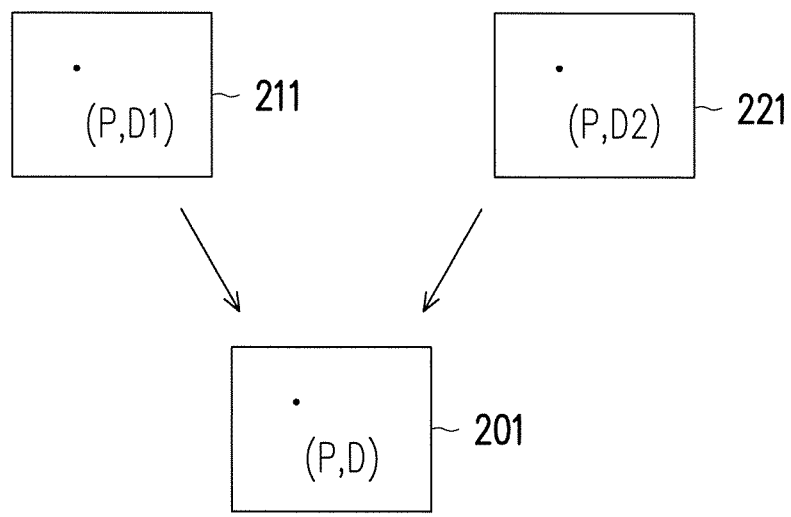
FIG. 6 shows a schematic of different depth maps showing different depth values at the same location.

FIG. 6 shows a schematic of different depth maps showing different depth values at the same location. Referring to FIG. 3, FIG. 5, and FIG. 6, in the image processing step S30, the image processing device 12 processes the first image 131 to obtain a first depth map 211 and processes the second image 132 to obtain a second depth map 221. In the merging step S40, the depth map merging circuit 12 of the image processing device 12 merges the first depth map 211 and the second depth map 221 to generate a final depth map 201 of the field 20.

A certain position P in the first depth map 211 has a first depth value $D_1$, and the position P in the second depth map 221 has a second depth value $D_2$. In the merging step S40, the depth map merging method of the image processing device 12 can be decided based on design requirements. For instance, in some embodiments, the depth map merging circuit 12 can select the first depth value $D_1$ or the second depth value $D_2$ as the depth value D of the position P in the final depth map 201. Alternatively, the depth map merging circuit 12 can also merge the first depth value $D_1$ and the second depth value $D_2$ by a weighted average computing method to obtain the depth value D of the position P in the final depth map 201. For instance (but not limited to), the depth map merging circuit 122 can calculate $D=W_1D_1+W_2D_2$ to obtain the depth value D of the position P in the final depth map 201, wherein $W_1$ represents the first weight value and $W_2$ represents the second weight value. Based on design requirements, the first weight value $W_1$ and the second weight value $W_2$ can be preset fixed values; alternatively, the depth map merging circuit 122 can dynamically decide the first weight value $W_1$ and the second weight value $W_2$ according to the first depth value $D_1$ and/or the second depth value $D_2$. The depth map merging method performed by the image processing device 12 can be implemented according to the following embodiments.

Figure 7:
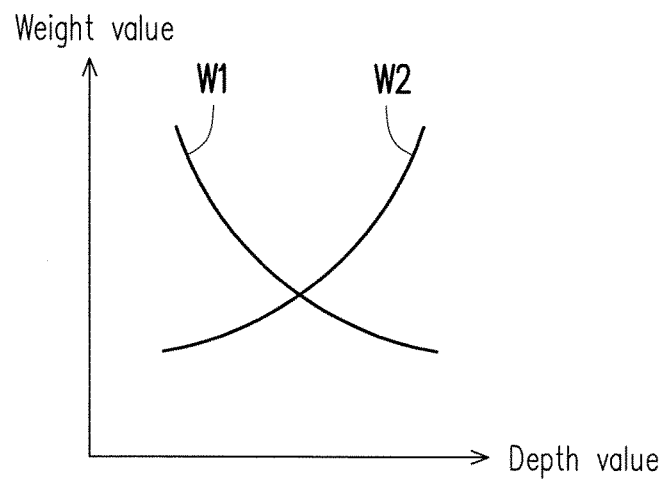
FIG. 7 is a search curve schematic describing weight values and depth values according to an embodiment of the invention.

FIG. 7 is a search curve schematic describing weight values and depth values according to an embodiment of the invention. In FIG. 7, the vertical axis is the weight value and the horizontal axis is the depth value. In some embodiments, according to the first depth value $D_1$ of the position P in the first depth map 211, the depth map merging circuit 122 can search the first weight value $W_1$ and the second weight value $W_2$ from the curve shown in FIG. 7. In some other embodiments, according to the second depth value $D_2$ of the position P in the second depth map 221, the depth map merging circuit 122 can search the first weight value $W_1$ and the second weight value $W_2$ from the curve shown in FIG. 7. After the first weighted value $W_1$ and the second weight value $W_2$ are obtained, the depth map merging circuit 122 can calculate $D=W_1D_1+W_2D_2$ to obtain the depth value D of the position P in the final depth map 201.

Figure 8:
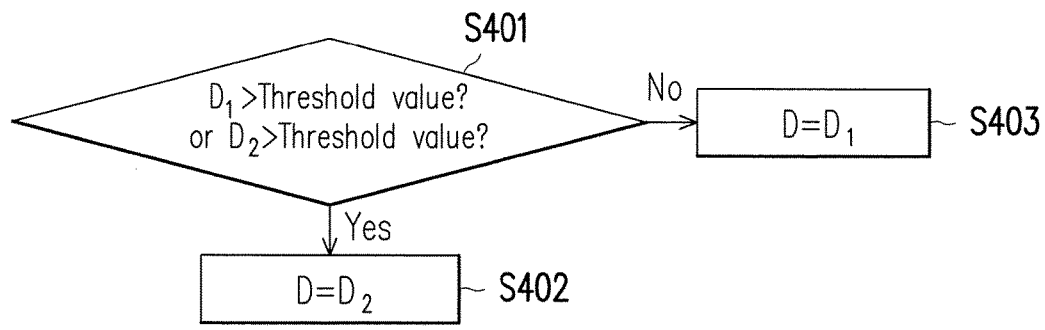
FIG. 8 is a process schematic describing a depth map merging method according to an embodiment of the invention.

FIG. 8 is a process schematic describing a depth map merging method according to an embodiment of the invention. Referring to FIG. 3, FIG. 6, and FIG. 8, the depth map merging circuit 122 can dynamically decide the first weight value $W_1$ and the second weight value $W_2$ according to the first depth value $D_1$ (or the second depth value $D_2$). In step S401, when the first depth value $D_1$ of the position P in the first depth map 211 (or the second depth value $D_2$ of the position P in the second depth map 221) is greater than a certain threshold value, the depth map merging circuit 12 can select the second depth value $D_2$ as the depth value of the position P in the final depth map 201 (step S402). Alternatively, the depth map merging circuit 12 selects the first depth value $D_1$ as the depth value D of the position P in the final depth map 201 (step S403). The depth values in the depth map can be shown as grayscale values. For instance, lighter gray represents a smaller depth value and can correspond to a closer position to the depth-sensing device 100 in the field 20, and a darker gray represents a greater depth value and can correspond to a farther position to the depth-sensing device 100 in the field 20.

For instance, the first depth value $D_1$ of the position P in the first depth map 211 is 150 and the second depth value $D_2$ of the position P in the second depth map 221 is 200, and the threshold value is 100. In step S401, the first depth value $D_1$ (or the second depth value $D_2$) is greater than the threshold value (100), and therefore step S402 is executed. In step S402, the depth map merging circuit 122 sets the depth value D of the position P in the final depth map 201 to 200.

It is assumed that the first depth value $D_1$ of the position P in the first depth map 211 is 30 and the second depth value $D_2$ of the position P in the second depth map 221 is 80, and the threshold value is 100. In step S401, the first depth value $D_1$ (or the second depth value $D_2$) is smaller than the threshold value (100), and therefore step S403 is executed. In step S403, the depth map merging circuit 122 determines the depth value of the position P in the final depth map 201 is 30.

Figure 9:
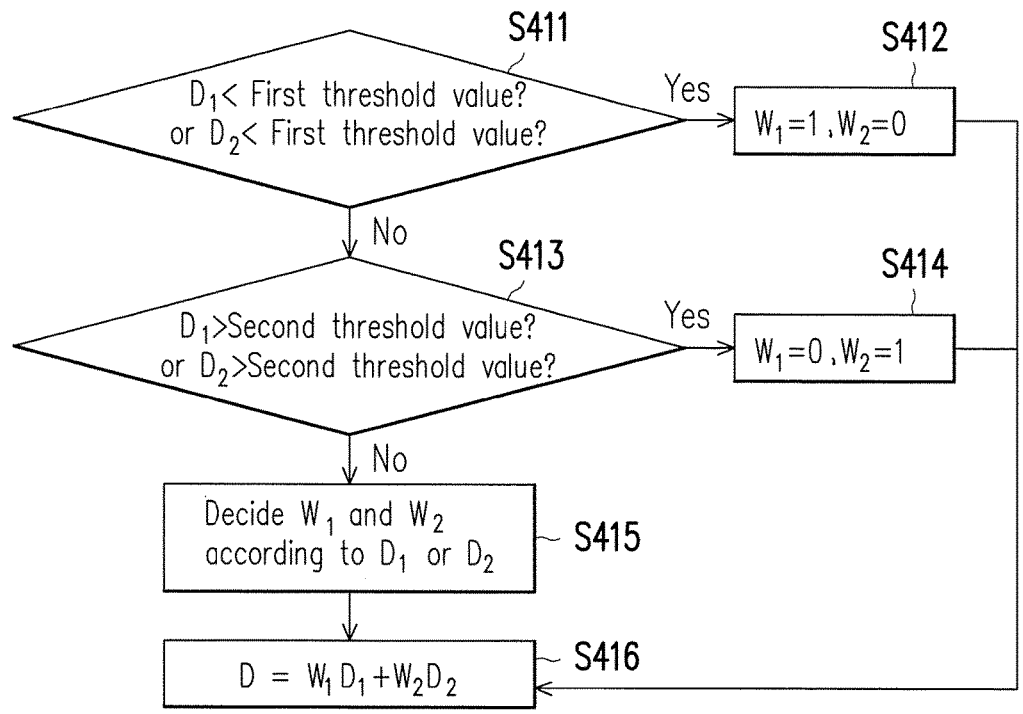
FIG. 9 is a process schematic describing a depth map merging method according to another embodiment of the invention.
Figure 10:
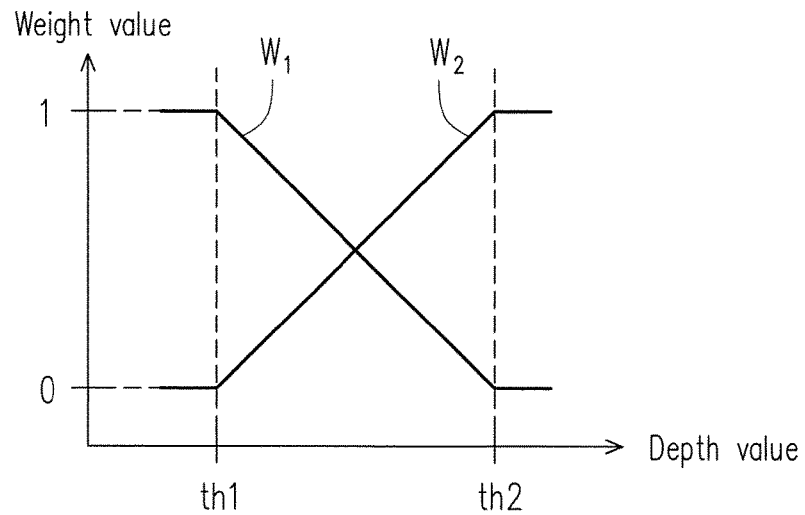
FIG. 10 is a search curve schematic describing weight values and depth values according to another embodiment of the invention.

FIG. 9 is a process schematic describing a depth map merging method according to another embodiment of the invention. FIG. 10 is a search curve schematic describing weight values and depth values according to another embodiment of the invention. In FIG. 10, the vertical axis is the weight value and the horizontal axis is the depth value. Referring to FIG. 3, FIG. 6, FIG. 9, and FIG. 10, the depth map merging circuit 122 can dynamically decide the first weight value $W_1$ and the second weight value $W_2$ according to the first depth value $D_1$ (or the second depth value $D_2$). In step S411, when the first depth value $D_1$ of the position P in the first depth map 211 (or the second depth value $D_2$ of the position P in the second depth map 221) is smaller than a first threshold value th1, the depth map merging circuit 122 can set the first weight value $W_1$ to 1 and set the second weight value $W_2$ to 0 (step S412). When the first depth value $D_1$ of the position P in the first depth map 211 (or the second depth value $D_2$ of the position P in the second depth map 221) is determined to be greater than a second threshold value th2 in step S413, the depth map merging circuit 122 can set the first weight value $W_1$ to 0 and set the second weight value $W_2$ to 1 (step S414).

Moreover, when the first depth value $D_1$ of the position P in the first depth map 211 (or the second depth value $D_2$ of the position P in the second depth map 221) is greater than the first threshold value th1 and smaller than the second threshold value th2, the depth map merging circuit 122 can dynamically decide the first weight value $W_1$ and the second weight value $W_2$ according to the first depth value $D_1$ (or the second depth value $D_2$) (step S415). In some embodiments, according to the first depth value $D_1$ of the position P in the first depth map 211, the depth map merging circuit 122 can search the first weight value $W_1$ and the second weight value $W_2$ from the curve shown in FIG. 10. In some other embodiments, according to the second depth value $D_2$ of the position P in the second depth map 221, the depth map merging circuit 122 can search the first weight value $W_1$ and the second weight value $W_2$ from the curve shown in FIG. 10. After the first weight value $W_1$ and the second weight value $W_2$ are obtained, the depth map merging circuit 122 can calculate $D=W_1D_1+W_2D_2$ to obtain the depth value D of the position P in the final depth map 201 (step S416).

Figure 11:
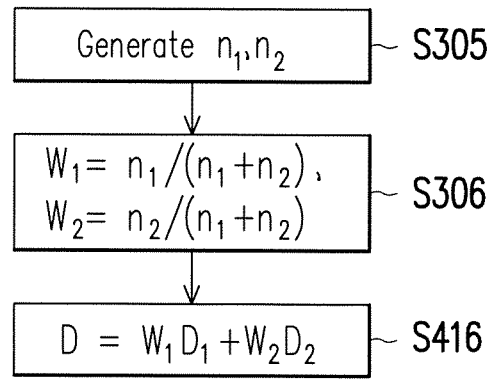
FIG. 11 is a process schematic describing a depth map merging method according to yet another embodiment of the invention.

FIG. 11 is a process schematic describing a depth map merging method according to yet another embodiment of the invention. Referring to FIG. 3, FIG. 6, and FIG. 11, in step S305, the decoding circuit 121 can decode (depth map algorithm) the first image 131 and the second image 132. During the decoding (depth map algorithm) process, the decoding circuit 121 can generate a normalized cross-correlation (NCC) value. For instance, when the first projection pattern 14 is projected to the field 20, the decoding circuit 121 can compare the first image 131 and the ground truth pattern (the first projection pattern 14) to calculate the degree of similarity between the first image 131 and the ground truth pattern to obtain the first depth pattern 211. When calculating the degree of similarity, the decoding circuit 121 can generate a NCC value at a different position in the first depth map 211. NCC is prior art and is therefore not repeated herein. By extension, during the decoding process (depth map algorithm) of the second image 132, the decoding circuit 121 can generate a NCC value at a different position in the second depth map 221.

The decoding circuit 121 can decode (depth map algorithm) the first image 131 to obtain a first NCC value $n_1$ of the position P in the first depth map 211. The decoding circuit 121 can decode (depth map algorithm) the second image 132 to obtain a second NCC value $n_2$ of the position P in the second depth map 221. In step S306, the depth map merging circuit 122 can dynamically decide the first weight value $W_1$ and the second weight value $W_2$ according to the first NCC value $n_1$ and the second NCC value $n_2$. For instance (but not limited to), the depth map merging circuit 122 can set the first weight value $W_1=n_1/(n_1+n_2)$ and set the second weight value $W_2=n_2/(n_1+n_2)$. After the first weight value $W_1$ and the second weight value $W_2$ are obtained, the depth map merging circuit 122 can calculate $D=W_1D_1+W_2D_2$ to obtain the depth value D of the position P in the final depth map 201 (step S416).

Figure 12:
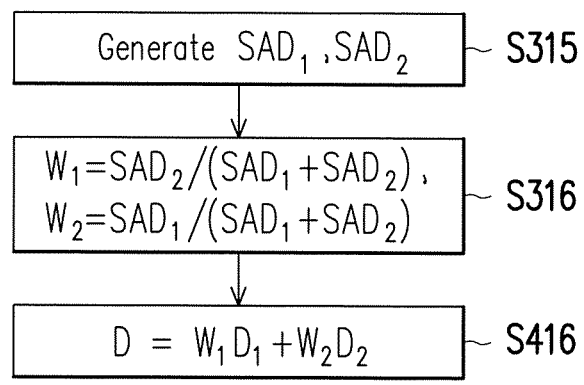
FIG. 12 is a process schematic describing a depth map merging method according to still yet another embodiment of the invention.

FIG. 12 is a process schematic describing a depth map merging method according to still yet another embodiment of the invention. Referring to FIG. 3, FIG. 6, and FIG. 12, in step S315, the decoding circuit 121 can decode (depth map algorithm) the first image 131 and the second image 132. During the decoding (depth map algorithm) process, the decoding circuit 121 can generate a sum of absolute difference (SAD) value. For instance, when the first projection pattern 14 is projected to the field 20, the decoding circuit 121 can compare the first image 131 and the ground truth pattern (the first projection pattern 14) to calculate the degree of similarity between the first image 131 and the ground truth pattern to obtain the first depth pattern 211. When calculating the degree of similarity, the decoding circuit 121 can generate a SAD value at a different position in the first depth map 211. SAD value is prior art and is therefore not repeated herein. By extension, during the decoding (depth map algorithm) process of the second image 132, the decoding circuit 121 can generate an SAD value at a different position in the second depth map 221.

The decoding circuit 121 can decode (depth map algorithm) the first image 131 to obtain a first SAD value $SAD_1$ of the position P in the first depth map 211. The decoding circuit 121 can decode (depth map algorithm) the second image 132 to obtain a second SAD value $SAD_2$ of the position P in the second depth map 221. In step S316, the depth map merging circuit 122 can dynamically decide the first weight value $W_1$ and the second weight value $W_2$ according to the first SAD value $SAD_1$ and the second SAD value $SAD_2$. For instance (but not limited to), the depth map merging circuit 122 can set the first weight value $W_1=SAD_2/(SAD_1+SAD_2)$ and set the second weight value $W_2=SAD_1/(SAD_1+SAD_2)$. After the first weight value $W_1$ and the second weight value $W_2$ are obtained, the depth map merging circuit 122 can calculate $D=W_1D_1+W_2D_2$ to obtain the depth value D of the position P in the final depth map 102 (step S416).

Base on the above, the depth-sensing device 100 and the depth-sensing method of the embodiments of the invention can adopt an image capture device having a fixed focal length. The depth-sensing device 100 can alternately project the first projection pattern 14 having a low density and the second projection pattern 15 having a high density to the same field to detect the near-field region 21 and the far-field region 22 in the field 20. Based on the first projection pattern 14 and the second projection pattern 15 having different densities, the image processing device 12 can obtain the first depth map 211 and the second depth map 221 having different content. The image processing device 12 can at least merge the first depth map 211 and the second depth map 221 to build the final depth map 201 of the field 20. Therefore, the working range of the depth-sensing device 100 can be effectively expanded.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A depth-sensing device, comprising:
   a projection device, configured to project a first projection pattern to a field at a first time, and project a second projection pattern to the field at a second time, wherein a density of the first projection pattern is lower than a density of the second projection pattern;
   an image capture device, configured to capture the first projection pattern projected to the field at the first time to obtain a first image, and capture the second projection pattern projected to the field at the second time to obtain a second image; and
   an image processing device, coupled to the projection device and the image capture device, configured to perform a depth map algorithm to the first image according to the first projection pattern to obtain a first depth map and perform a depth map algorithm to the second image according to the second projection pattern to obtain a second depth map, wherein the image processing device at least merges the first depth map and the second depth map to generate a final depth map of the field.

2. The depth-sensing device of claim 1, wherein the projection device comprises:
   a light emitter;

a lens set disposed in an optical path of the light emitter; and a control circuit coupled to the light emitter, wherein the control circuit controls the light emitter to generate the first projection pattern or the second projection pattern and alternately project the first projection pattern and the second projection pattern to the field.

3. The depth-sensing device of claim 2, wherein the light emitter comprises a vertical-cavity surface-emitting laser array.

4. The depth-sensing device of claim 2, wherein the lens set comprises a light diffusion device.

5. The depth-sensing device of claim 1, wherein the first projection pattern and the second projection pattern comprise a disordered spot pattern, and a spot density of the first projection pattern is lower than a spot density of the second projection pattern.

6. The depth-sensing device of claim 1, wherein the image processing device comprises:
 a decoding circuit coupled to the image capture device, wherein the decoding circuit respectively decodes the first image and the second image according to a plurality of decoding parameters to respectively generate the first depth map and the second depth map; and
 a depth map merging circuit coupled to the decoding circuit, wherein the depth map merging circuit merges the first depth map and the second depth map to generate the final depth map of the field.

7. The depth-sensing device of claim 6, wherein a position in the first depth map has a first depth value, the position in the second depth map has a second depth value, and when the first depth value or the second depth value is greater than a threshold value, the depth map merging circuit selects the second depth value as a depth value of the position in the final depth map, otherwise the depth map merging circuit selects the first depth value as the depth value of the position in the final depth map.

8. The depth-sensing device of claim 6, wherein a position in the first depth map has a first depth value $D_1$, the position in the second depth map has a second depth value $D_2$, the depth map merging circuit calculates $W_1D_1+W_2D_2$ to obtain a depth value D of the position in the final depth map, $W_1$ represents a first weight value, and $W_2$ represents a second weight value.

9. The depth-sensing device of claim 8, wherein the depth map merging circuit dynamically decides the first weight value $W_1$ and the second weight value $W_2$ according to the first depth value $D_1$ or the second depth value $D_2$.

10. The depth-sensing device of claim 8, wherein:
 the first weight value $W_1$ is 1 and the second weight value $W_2$ is 0 when the first depth value $D_1$ or the second depth value $D_2$ is less than a first threshold value,
 the depth map merging circuit dynamically decides the first weight value $W_1$ and the second weight value $W_2$ according to the first depth value $D_1$ or the second depth value $D_2$ when the first depth value $D_1$ or the second depth value $D_2$ is greater than the first threshold value and less than a second threshold value, and
 the first weight value $W_1$ is 0 and the second weight value $W_2$ is 1 when the first depth value $D_1$ or the second depth value $D_2$ is greater than the second threshold value.

11. The depth-sensing device of claim 8, wherein the decoding circuit decodes the first image to obtain a first normalized cross-correlation value $n_1$ of the position in the first depth map, the decoding circuit decodes the second image to obtain a second normalized cross-correlation value $n_2$ of the position in the second depth map, and the depth map merging circuit dynamically decides the first weight value $W_1$ and the second weight value $W_2$ according to the first normalized cross-correlation value $n_1$ and the second normalized cross-correlation value $n_2$.

12. The depth-sensing device of claim 8, wherein the decoding circuit decodes the first image to obtain a first sum of absolute difference value $SAD_1$ of the position in the first depth map, the decoding circuit decodes the second image to obtain a second sum of absolute difference value $SAD_2$ of the position in the second depth map, and the depth map merging circuit dynamically decides the first weight value $W_1$ and the second weight value $W_2$ according to the first sum of absolute difference value $SAD_1$ and the second sum of absolute difference value $SAD_2$.

13. A depth-sensing method, comprising:
 a projection step, projecting a first projection pattern to a field at a first time, and projecting a second projection pattern to the field at a second time, wherein a density of the first projection pattern is lower than a density of the second projection pattern;
 an image capture step, capturing the first projection pattern projected to the field at the first time to obtain a first image, and capturing the second projection pattern projected to the field at the second time to obtain a second image;
 an image processing step, performing a depth map algorithm to the first image according to the first projection pattern to obtain a first depth map, and performing a depth map algorithm to the second image according to the second projection pattern to obtain a second depth map; and
 a merging step, at least merging the first depth map and the second depth map to generate a final depth map of the field.

14. The depth-sensing method of claim 13, wherein the image processing step comprises:
 respectively decoding the first image and the second image according to at least one decoding parameter to respectively generate the first depth map and the second depth map.

15. The depth-sensing method of claim 13, wherein a position in the first depth map has a first depth value, the position in the second depth map has a second depth value, and the merging step comprises:
 selecting the second depth value as a depth value of the position in the final depth map when the first depth value or the second depth value is greater than a threshold value, otherwise selecting the first depth value as the depth value of the position in the final depth map.

16. The depth-sensing method of claim 13, wherein a position in the first depth map has a first depth value $D_1$, the position in the second depth map has a second depth value $D_2$, and the merging step comprises:
 calculating $W_1D_1+W_2D_2$ to obtain a depth value D of the position in the final depth map, wherein $W_1$ represents a first weight value and $W_2$ represents a second weight value.

17. The depth-sensing method of claim 16, wherein the merging step further comprises:
 dynamically deciding the first weight value $W_1$ and the second weight value $W_2$ according to the first depth value $D_1$ or the second depth value $D_2$.

18. The depth-sensing method of claim 16, wherein the merging step further comprises:

setting the first weight value $W_1$ to 1 and setting the second weight value $W_2$ to 0 when the first depth value $D_1$ or the second depth value $D_2$ is less than a first threshold value;

dynamically deciding the first weight value $W_1$ and the second weight value $W_2$ according to the first depth value $D_1$ or the second depth value $D_2$ when the first depth value $D_1$ or the second depth value $D_2$ is greater than the first threshold value and less than a second threshold value; and setting the first weight value $W_1$ to 0 and setting the second weight value $W_2$ to 1 when the first depth value $D_1$ or the second depth value $D_2$ is greater than the second threshold value.

19. The depth-sensing method of claim 16, wherein the image processing step decodes the first image to obtain a first normalized cross-correlation value $n_1$ of the position in the first depth map, the image processing step decodes the second image to obtain a second normalized cross-correlation value $n_2$ of the position in the second depth map, and the merging step further comprises:

dynamically deciding the first weight value $W_1$ and the second weight value $W_2$ according to the first normalized cross-correlation value $n_1$ and the second normalized cross-correlation value $n_2$.

20. The depth-sensing method of claim 16, wherein the image processing step decodes the first image to obtain a first sum of absolute difference value $SAD_1$ of the position in the first depth map, the image processing step decodes the second image to obtain a second sum of absolute difference value $SAD_2$ of the position in the second depth map, and the merging step further comprises:

dynamically deciding the first weight value $W_1$ and the second weight value $W_2$ according to the first sum of absolute difference value $SAD_1$ and the second sum of absolute difference value $SAD_2$.

* * * * *